United States Patent
Huang et al.

(10) Patent No.: US 8,193,540 B2
(45) Date of Patent: Jun. 5, 2012

(54) SMD DIODE HOLDING STRUCTURE AND PACKAGE THEREOF

(75) Inventors: Yi-Ming Huang, Jhudong Township, Hsinchu County (TW); Hsiang-Cheng Hsieh, Pingjhen (TW)

(73) Assignee: Lextar Electronics Corp., Hsinchu (TW)

( * ) Notice: Subject to any disclaimer, the term of this patent is extended or adjusted under 35 U.S.C. 154(b) by 128 days.

(21) Appl. No.: 12/588,415

(22) Filed: Oct. 15, 2009

(65) Prior Publication Data
US 2010/0032709 A1  Feb. 11, 2010

Related U.S. Application Data

(63) Continuation of application No. 11/819,178, filed on Jun. 26, 2007, now Pat. No. 7,679,090.

(30) Foreign Application Priority Data

Oct. 25, 2006  (TW) .............................. 95139336 A

(51) Int. Cl.
*H01L 27/15* (2006.01)
(52) U.S. Cl. ..................... 257/81; 257/89; 257/E33.059; 257/E33.066; 438/124

(58) Field of Classification Search ..................... 257/81, 257/89, E33.059, E33.066; 438/124
See application file for complete search history.

(56) References Cited

U.S. PATENT DOCUMENTS

| 7,208,772 B2 * | 4/2007 | Lee et al. | 257/99 |
| 7,342,357 B2 * | 3/2008 | Sakano et al. | 313/512 |
| 2006/0022216 A1 * | 2/2006 | Chikugawa | 257/99 |
| 2007/0018191 A1 * | 1/2007 | Roh et al. | 257/99 |

* cited by examiner

*Primary Examiner* — Howard Weiss
*Assistant Examiner* — John C Ingham
(74) *Attorney, Agent, or Firm* — Rosenberg, Klein & Lee

(57) ABSTRACT

An SMD diode holding structure includes a plastic housing and a plurality of metal holders. Two ends of the plastic housing from a function area and a notch. The metal holder has a base portion and a connecting pin portion. The top and bottom surfaces of the base portion are exposed to the function area and the notch. The top surface of one base portion in the function area is connected with an LED chip, and the bottom surface of another base portion in the notch is connected with the anti-ESD chip. The LED chip, the anti-ESD chip, and the base portion are connected with a conductive wire. The function area is covered with a first sealing compound, and the notch is covered with a second sealing compound. Light emitted from the LED chip is uniformly reflected in the function area, and the brightness is uniform.

9 Claims, 5 Drawing Sheets

SMD DIODE HOLDING STRUCTURE AND PACKAGE THEREOF

CROSS REFERENCE TO RELATED APPLICATION

This application is a continuation application claiming only subject matter disclosed in prior application of U.S. application Ser. No. 11/819,178 filed on Jun. 6, 2007, now U.S. Pat. No. 7,679,090 directed to 35 USC 120. The contents of all of which are incorporated herein their entirety.

BACKGROUND OF THE INVENTION

1. Field of the Invention

The present invention relates to an LED. In particular, this invention relates to an SMD diode holding structure and a package thereof that improves the brightness and can be easily manufactured.

2. Description of the Related Art

FIG. 1 shows the SMD (surface mount device) diode packaging structure of the prior art. On two metal holders 11, a plastic housing 12 is molded and has a concave portion in the interior of the plastic housing 12. An LED chip 13 is located on one of the metal holders 11 in the plastic housing 12. The LED chip 13 and the two metal holders 11 are connected with two conductive wires 14. In order to prevent the LED chip 13 from being damaged by static electricity, another metal holder 11 is connected with an anti-ESD chip 15. The anti-ESD chip 15 is connected with the metal holder 11 via another conductive wire 14'. Finally, the plastic housing is covered with epoxy resin 16. By exerting a voltage on the two metal holders, the LED chip 13 emits light and is protected by the anti-ESD chip 15.

However, in the SMD diode packaging structure of the prior art, due to the heights of the LED chip 13 and the anti-ESD chip 15, light emitted from the LED chip 13 has a high reflective rate between the wall in the plastic housing 12 and the metal holder 11. Moreover, when light passes through the anti-ESD chip 15, light is easily affected by the height of the anti-ESD chip 15, thereby light-shielding and light-absorbing effects are generated. The reflective rate is bad and the brightness of the LED is not uniform.

In order to solve the problem, Taiwan patent M261831, granted on 11 Apr. 2005, discloses an LED anti-ESD packaging structure. The LED anti-ESD packaging structure includes a holder 21 having a concave portion 211 on one surface of the holder 21, a protective element 22 fastened in the concave portion 211 via a pasting material 23 and connected with the holder 21 via a conductive wire 24, a molding element 25 packages the concave portion 211 and forms an arched concave cup 251 on a second surface that is disposed opposite to the concave portion, and an LED chip 26 that is fastened into the arched concave cup 251 via a pasting material 23' and connected with the holder 21 via two conductive wires 24'. When a voltage is exerted on the metal holders 21, the LED chip 26 emits light. By respectively fastening the protective element 22 and the LED chip 26 onto the holders 21, the light-shielding and light-absorbing effects caused by the protective element 22 are avoided.

The protective element 22 in the described LED anti-ESD packaging structure is fastened in the concave portion 211 via conductive silver glue. Next, the protective element 22 is connected with the conductive wire 24 and is fastened in the concave portion 211 of the holding structure by a pasting material 23. The molding element 25 packages the concave portion 211, the protective element 22, and the pasting material 23 by using an injection method or a molding method, thereby forming the arched concave cup 251. Finally, the holder 21 located on the other surface is fastened with the LED chip 26 and is connected with the conductive wires 24'.

However, in the manufacturing process, there are the following drawbacks:

1. The concave portion 211 is formed on the holder 21 via a punching method or an etching method. When the conductive wire 24 is wired, the holder 21 vibrates and the pulling force is unstable. The unstable force could cause the microdamage of LED/anti-ESD chips structure.

The product is unreliable.

2. The concave portion 211 has a concave-cup shape (as shown in FIG. 2). If too much of the silver glue that is used for fastening the protective element is applied, the silver glue will overflow the wall of the concave portion 211 and become attached to the side of the protective element 22. Electricity-leakages occur and a short circuit may ensue.

3. Whatever kind of material the molding element 25 is made of, the molding element 25 needs to reach a high temperature and a melting status to package the holders 21, the concave portion 211, the protective element 22 and the pasting material 23. In the packaging process, the pasting material 23 will deteriorate due to the high temperatures.

SUMMARY OF THE INVENTION

One particular aspect of the present invention is to provide an SMD diode holding structure that can improve the brightness of the LEDs. The SMD diode holding structure is connected with an LED chip and an Anti-ESD chip to form a diode packaging structure. The brightness is uniform, the manufacturing process is simple, and the SMD diode holding structure can be mass produced. The problems of short circuits occurring due to the silver glue overflowing and the second sealing compound deteriorating due to high temperatures are avoided, and the microcrack or microdamage of effective diode are avoided The SMD diode holding structure includes a plastic housing having a concave function area located in the interior of one surface of the plastic housing and a concave notch located in the interior of a second surface of the plastic housing, and a plurality of metal holders fastened in the plastic housing. Each metal holder has a base portion located in the plastic housing, and a connecting pin portion that extends to the outside of the plastic housing from the base portion. The top surface of the base portion is exposed to the function area, and the bottom surface of the base portion is exposed to the notch.

The top surface of one base portion is connected with an LED chip, and the LED chip and the top surface of the base portion are connected with a first conductive wire and are covered with a layer of first sealing compound. The bottom surface of a second base portion is connected with the anti-ESD chip, and the anti-ESD chip and the bottom surface of the base portion connected with the LED chip are connected with a second conductive wire and are covered with a layer of second sealing compound.

The present invention has the following characteristics:

1. By connected the LED chip on the function area and connecting the anti-ESD chip in the notch, light emitted from the LED chip is unaffected by the anti-ESD chip. Light is uniformly reflected in the function area, and the brightness is uniform.

2. After the plastic housing and the metal holders are combined, the manufacturing processes for the LED chip and the anti-ESD chip is performed. Therefore, the problem of the second sealing compound deteriorating due to the plastic housing being molded at high temperatures is avoided, thereby improving the yield rate. Testing costs and manufacturing costs are also thereby reduced. The manufacturing process is simple, and allows the SMD diode holding structure to be mass produced.

3. By forming the SMD diode holding structure and utilizing the structure of the metal holder and the plastic housing, the lack of reliability caused by the holder vibrating and the pulling force being unstable during the processes of connecting the ESD protecting chip and wiring the second conductive wire is also avoided.

4. By utilizing the structure between the metal holder and the notch, the problem of short circuits occurring due to the silver glue overflowing and attaching on the side of the anti-ESD chip is also avoided.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
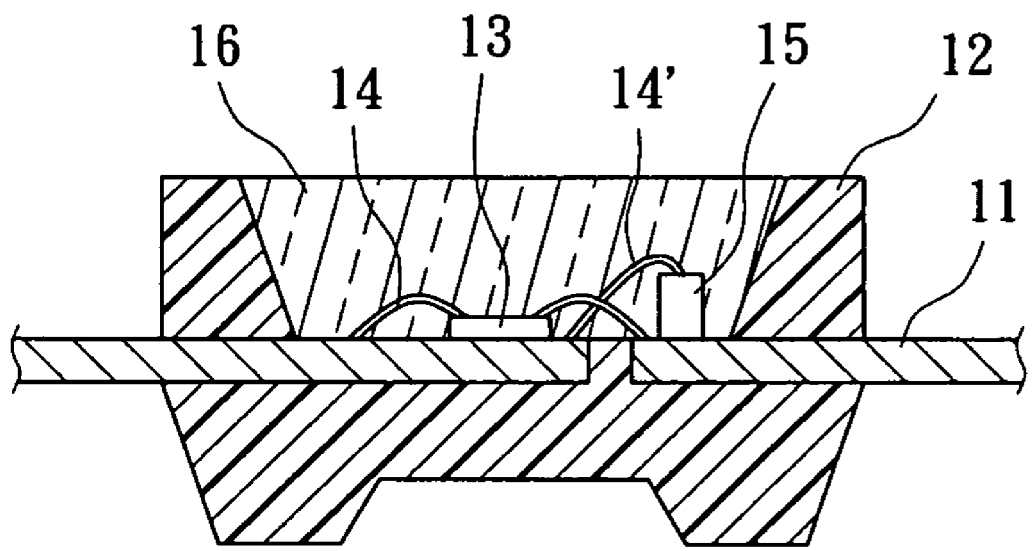
FIG. 1 is a schematic diagram of the SMD diode packaging structure of the prior art.
Figure 2:
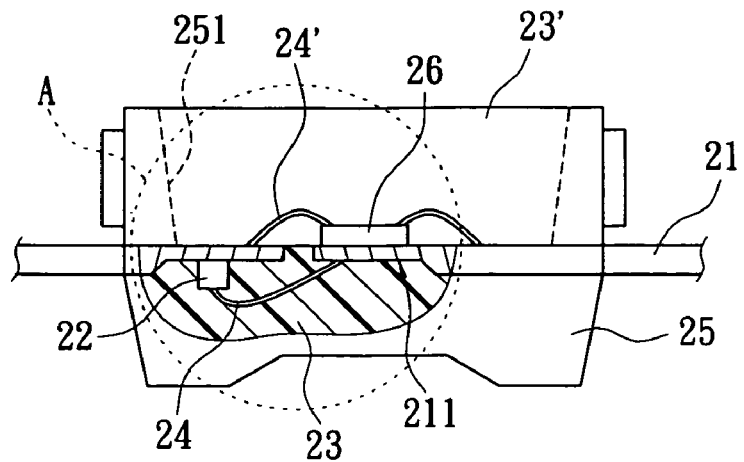
FIG. 2 is another schematic diagram of the SMD diode packaging structure of the prior art.
Figure 2A:
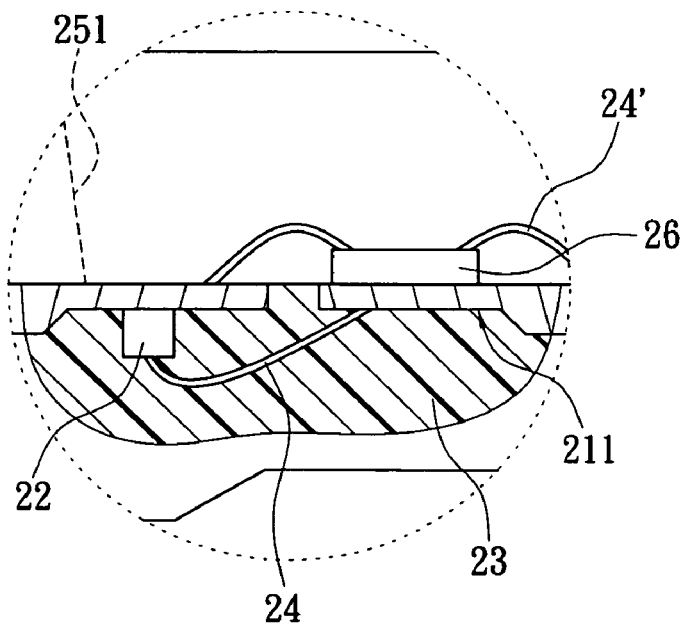
FIG. 2A is a detailed diagram of part A in FIG. 2.
Figure 3:
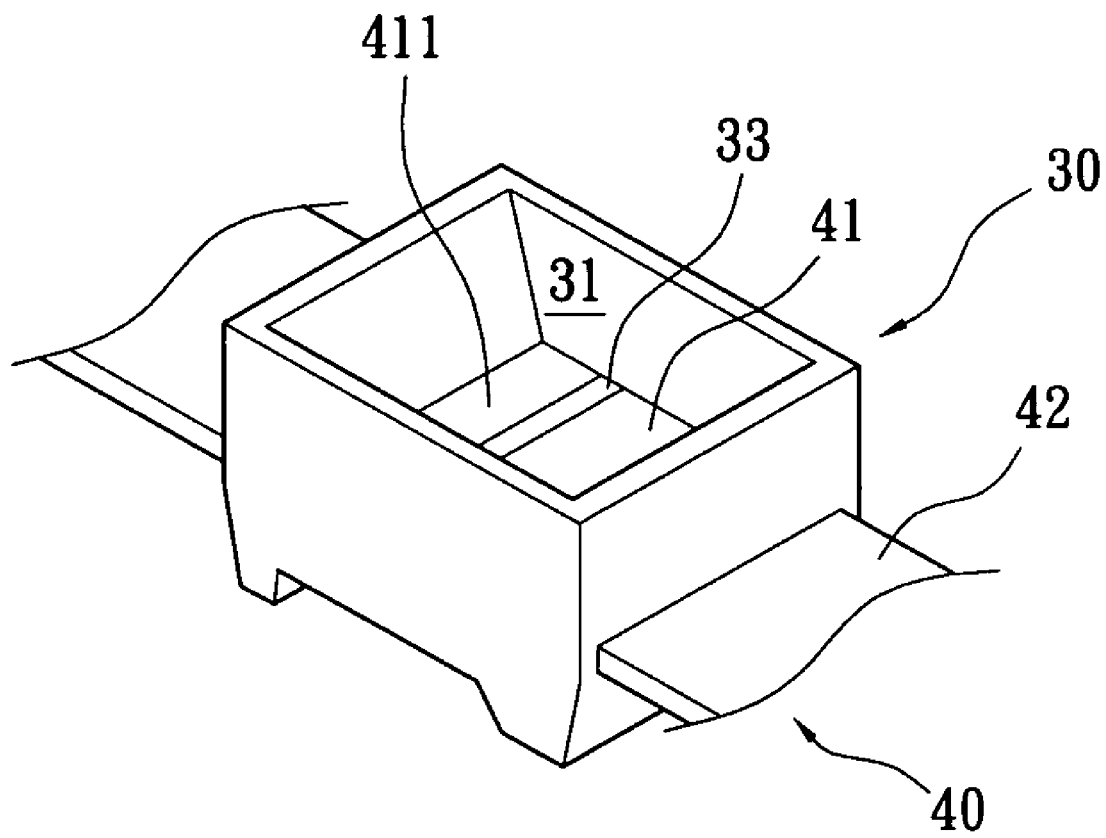
FIG. 3 is a perspective view of the present invention.
Figure 4:
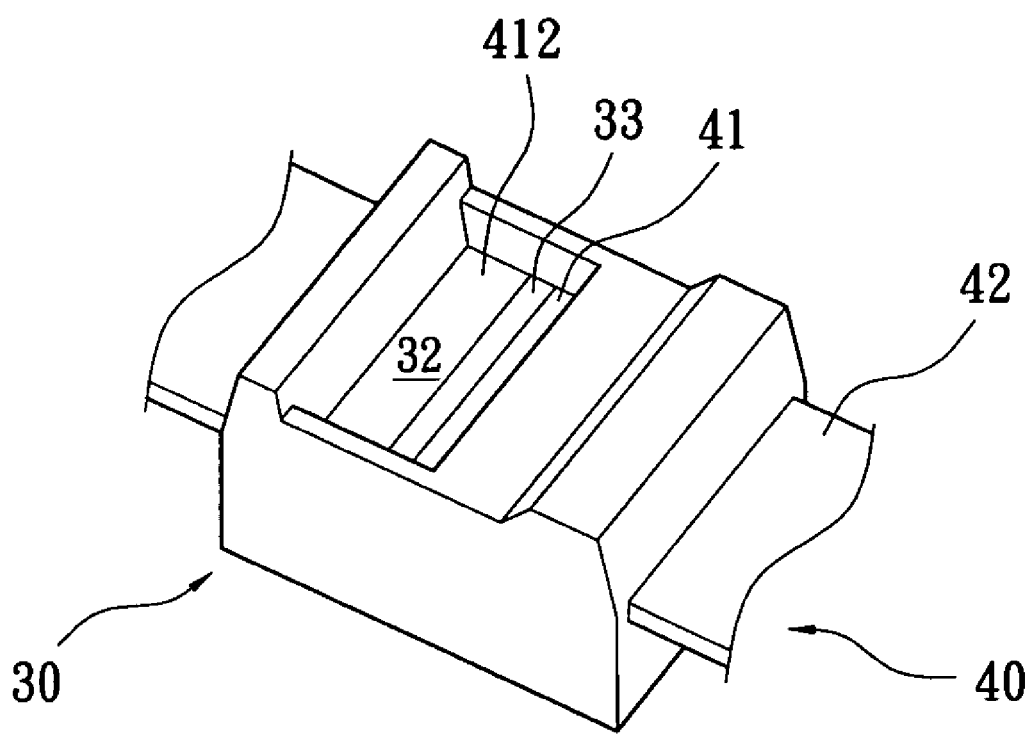
FIG. 4 is another perspective view of the present invention.

Reference is made to FIGS. 3 and 4, which show the SMD diode holding structure of the present invention. The SMD diode holding structure includes a plastic housing 30 and a plurality of metal holders 40.

Figure 5:
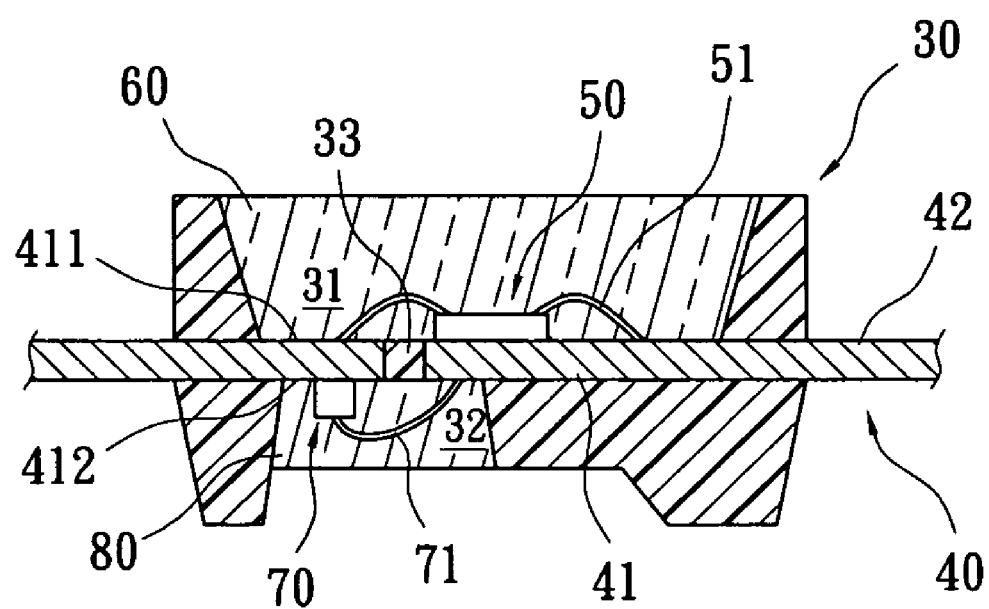
FIG. 5 is a cross-sectional view of the present invention connected with the LED chip and the anti-ESD chip.

The plastic housing 30 is rectangular. Alternatively, the plastic housing 30 can have a square, a polygonal, or a circular shape. In the interior of one surface of the plastic housing 30, a concave function area 31 is formed. The concave function area 31 has a slope, and a concave notch 32 is formed in the interior of a second surface of the plastic housing 30. The dimensions of the notch 32 may be smaller than that of the concave function area 31 because the size of the notch 32 can be formed related to the size of the anti-ESD chip 70. Furthermore, the small-size notch 32 is provided for reducing the amount of the second sealing compound 80 (as shown in FIG. 5). Moreover, the center of the notch 32 is misaligned with the center of the concave function area 31 for efficiently dissipating the heat of the LED chip 50. In other word, because the notch 32 is used to mount the anti-ESD chip 70, it is necessary to misalign the position of the anti-ESD chip 70 with the position of the LED chip 50 so that the heat of the LED chip 50 can be dissipated through the solid body (including the metal holders 40 and lower portion of the plastic housing 30 as shown in FIG. 5) The plastic housing 30 is made of a non-conductive material, such as polycarbonate (PC), polyphthalamide (PPA), polybutylene terephthalte (PBT), polymethyl methacrylate (PMMA), or other heat-molded resins, LCP (Liquid Crystal polymer) or ceramics etc.

The metal holder 40 is made of conductive materials, such as cooper, iron, etc. The metal holders are fastened to and connected with plastic housing 30 respectively. In this embodiment, the number of the metal holder 40 is two. However, the number can be three or more than three, depending on the user's requirements. The plastic housing 30 is molded via an injection method in order to fasten and connect the plastic housing 30 with each metal holder 40. Therefore, the SMD diode holder can be mass produced, and manufacturing costs are reduced.

Each metal holder 40 has a base portion 41 located on the bottom of the function area of the plastic housing 30, and a connecting pin portion 42 that extends to an outside of the plastic housing 30 from the base portion 41. The top surface 411 of the base portion 41 is exposed to the function area, and the bottom surface 412 of the base portion is exposed to the notch 32. The base portions are disposed at intervals. A separating block 33 is formed between the two base portions 41 by the plastic housing 30 to form a positive pole and a negative pole of the metal holder 40.

The surfaces (a top surface and a bottom surface) of the metal holder 40 are electroplated with a layer of metal reflective layer (not shown in the figure), such as silver, gold, palladium or other materials with a high reflective rate. Therefore, the reflective efficiency of the metal holder 40 is increased.

Reference is made to FIG. 5 in which the SMD diode packaging structure is illustrated. The top surface 411 of one base portion 41 is connected with an LED chip 50 by glue or eutectic metal bonding. The quantity of the LED chips 50 depends on the quantity of the metal holders 40. Alternatively, the base portion 41 of one metal holder 40 can have a plurality of LED chips 50. For example, the red, the green and the blue LED chips 50 are located on the base portion 40 to emit white light. Each LED chip 50 is connected with two first conductive wires 51. The two first conductive wires 51 are respectively connected with the top surfaces 411 of the base portion 41 that are opposite to each other and where their polarities are different, such as a positive pole and a negative pole. Next, the function area 31 of the plastic housing 30 is covered with a first sealing compound 60 that is pervious to light to package the LED chip 50 and the first conductive wires 51. Thereby, it prevents the LED chip 50 from being damaged by moisture.

The bottom surface 412 of a second base portion 41 that is opposite to the base portion 41 connected with the LED chip 50 is electrically connected with an anti-ESD chip 70 by using a silver glue. The anti-ESD chip 70 is connected with a second conductive wire 71, and the second conductive wire 71 is connected with the bottom surface 412 of the base portion connected with the LED chip 50. The quantity of the second conductive wires 71 depends on the quantity of the metal holders 40. For example, two metal holders 40 connect with one second conductive wire 71. When the quantity of metal holder 40 is three, two metal holders 40 are connected with the LED chips 50 and one metal holder 40 is connected with the anti-ESD chip 70. Two second conductive wires 71 are required to connect to the two metal holders 40. The notch 32 is covered with a second sealing compound 80 to cover the anti-ESD chip 70 and the second conductive wires 71. Thereby, it prevents the anti-ESD chip 70 from being damaged by moisture.

The first sealing compound 60 can be an epoxy resin, a silicone, or other types of resin. Furthermore, the first sealing compound 60 can be mixed with a phosphor powder 9 (such as red phosphor powder) to change its color. The material of the second sealing compound 80 can be the same as the material of the first sealing compound 60. The second sealing compound 80 can be pervious to light or not.

Moreover, the connecting pin portions 42 extend outwards to an outside of the plastic housing 30 from the base portion, are located on two opposite sides, and are bent to be pasted on the bottom of the plastic housing 30 (not shown in the figure). Thereby, a top view SMD diode is formed. Alternatively, the connecting pin portions 42 extend outwards to an outside of the plastic housing 30 from the base portion, are located on the same side, and are bent to be pasted on the side surface of the plastic housing 30 (not shown in the figure). Thereby, a side view SMD diode is formed.

By exerting a voltage on the connecting pin portions 42, the voltage is transmitted to the base portion 41 via the first conductive wire 51 so that the LED chip 50 emits light. By connecting the anti-ESD chip 70 and the second conductive wires 71 with the base portion 41 of the opposite metal holder 40, the LED chip 50 is protected from ESD. It prevents the LED chip from being damaged by ESD.

The SMD diode holding structure makes the brightness uniform, prevents the LED chip 50 from being damaged by ESD, allows mass production, and improves reliability.

The present invention has the following characteristics:

1. By connected the LED chip 50 on the function area 31 and connecting the anti-ESD chip 70 in the notch 32, light emitted from the LED chip 70 is unaffected by the anti-ESD chip 70. Light is uniformly reflected in the function area 31, and the brightness is uniform.

2. After the plastic housing 30 and the metal holders 40 are combined to form the SMD diode holding structure, the manufacturing processes for the LED chip and the anti-ESD chip is performed. Therefore, the problem of the second sealing compound deteriorating due to the plastic housing 30 being molded at high temperatures is avoided, and the yield rate is increased. Testing costs and manufacturing costs are also reduced. The manufacturing process is simple, and allows mass production.

3. By forming the SMD diode holding structure and utilizing the structure of the metal holder 40 and the plastic housing 30, the problem of unreliability caused by the metal holder 40 oscillating and pulling force being unstable during the manufacturing process of connecting the ESD protecting chip 70 and wiring the second conductive wire 71 is also avoided.

4. By utilizing the structure between the metal holder 40 and the notch 32, including the notch 32 having a large dimension, and the base portion 41 being a plate, the problem of a short circuit occurring due to the silver glue overflowing and attaching on the side of the anti-ESD chip 70 is also avoided.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An SMD diode holding structure, comprising:
a plastic housing having a concave function area located in an interior of one surface of the plastic housing and a concave notch located in an interior of a second surface of the plastic housing, a center of the concave notch being offset in relation to a center of the concave function area, and a size of the concave notch being smaller than a size of the concave function area;
a plurality of metal holders defining a plurality of first and second conductor elements horizontally displaced each from the other by a predetermined distance fastened in the plastic housing, wherein each metal holder has a base portion located in the plastic housing and a connecting pin portion extending to an outside of the plastic housing from the base portion, a top surface of the base portion is exposed to the function area, and a bottom surface of the base portion is exposed to the notch;
a first chip mounted to a top surface of one of said first conductor elements;
a second chip mounted on a lower surface of one of said second conductor elements, said first and second conductor elements forming a singular layer, and
an insulating separating block formed between each of said first and second conductor elements and directly contacting the concave notch.

2. The SMD diode holding structure as claimed in claim 1, wherein the plastic housing is made of a non-conductive material.

3. The SMD diode holding structure as claimed in claim 1, wherein a surface of the metal holder has a metal reflective layer.

4. The SMD diode holding structure as claimed in claim 1, wherein the separating block separates the polarity of the metal holder.

5. The SMD diode holding structure as claimed in claim 4, wherein the separating block is made of plastic housing.

6. The SMD diode holding structure as claimed in claim 1, wherein the connecting pin portions are located on the same side of the plastic housing.

7. The SMD diode holding structure as claimed in claim 1, wherein the connecting pin portions are located on two sides of the plastic housing respectively.

8. The SMD diode holding structure as claimed in claim 1, wherein the first chip is light emitting diode (LED).

9. The SMD diode holding structure as claimed in claim 1, wherein the second chip is anti-ESD chip.

* * * * *